(12) United States Patent
Oh et al.

(10) Patent No.: US 7,319,366 B2
(45) Date of Patent: Jan. 15, 2008

(54) OFFSET LOCAL OSCILLATOR WITHOUT USING FREQUENCY DIVIDER

(75) Inventors: Nam-Jin Oh, Dong-Gu (KR); Sang-Gug Lee, Yusung-gu (KR)

(73) Assignee: Research and Industrial Cooperation Group, Daejon-shi (KR)

( * ) Notice: Subject to any disclaimer, the term of this patent is extended or adjusted under 35 U.S.C. 154(b) by 87 days.

(21) Appl. No.: 11/409,886

(22) Filed: Apr. 24, 2006

(65) Prior Publication Data

US 2007/0173218 A1 Jul. 26, 2007

(30) Foreign Application Priority Data

Jan. 23, 2006 (KR) ...................... 10-2006-0006949

(51) Int. Cl.
*H03B 5/12* (2006.01)
*H03B 21/01* (2006.01)

(52) U.S. Cl. .................... 331/37; 331/46; 331/117 FE; 331/117 V; 455/318

(58) Field of Classification Search .................. 331/37, 331/38, 46, 117 R, 117 FE, 117 D, 177 R, 331/177 V; 455/313, 318
See application file for complete search history.

(56) References Cited

U.S. PATENT DOCUMENTS 6,836,180 B1 * 12/2004 Kwok ......................... 327/552

OTHER PUBLICATIONS

H. Darabi et al., A 2.4-GHz CMOS Transceiver for Bluetooth, *IEEE Journal of Solid-State Circuits*, (Dec. 2001), p. 2016-2024, vol. 36, No. 12.
P. Zhang et al., A 5-GHz Direct-Conversion CMOS Transceiver, *IEEE Journal of Solid-State Circuits*, (Dec. 2003), p. 2232-2238, vol. 38, No. 12.
L. Perraud et al., A Direct-Conversion CMOS Transceiver for the 802.11 a/b/g WLAN Standard Utilizing a Cartesian Feedback Transmitter, *IEEE Journal of Solid-State Circuits*, (Dec. 2004), p. 2226-2238, vol. 39, No. 12.

* cited by examiner

*Primary Examiner*—David Mis
(74) *Attorney, Agent, or Firm*—The Webb Law Firm (57) ABSTRACT

A local oscillator without a frequency divider is provided. The local oscillator includes a quadrature voltage controlled oscillator generating I and Q signals having a frequency which is one-third of a local oscillation frequency, and a differential second-harmonic signal having a frequency which is two-thirds of the local oscillation frequency, a poly-phase filter converting the differential second-harmonic signal input from the quadrature voltage controlled oscillator into I and Q signals, and a single side band (SSB) mixer receiving the I and Q signals having the frequency which is one-third of the local oscillation frequency from the quadrature voltage controlled oscillator as an input and receiving the I and Q signals having the frequency which is two-thirds of the local oscillation frequency from the poly-phase filter as an input, and outputting the I and Q signals having the local oscillation frequency.

11 Claims, 10 Drawing Sheets

OFFSET LOCAL OSCILLATOR WITHOUT USING FREQUENCY DIVIDER

BACKGROUND OF THE INVENTION

1. Field of the Invention

The present invention relates to a local oscillator without a frequency divider, and more particularly, to a local oscillator generating I and Q signals having a local oscillation frequency using a quadrature voltage controlled oscillator, a poly-phase filter, and a single side band (SSB) mixer.

2. Description of the Related Art

In modern communication technology, most amplitude and phase/frequency modulation techniques having In-phase and Quadrature-phase signal components I and Q require I/Q frequency modulation, which requires the phase of a radio frequency (RF) signal or a local oscillator (LO) signal to be modulated by 90 degrees.

In this case, the amplitude of the In-phase signal is not exactly the same as the amplitude of the quadrature-phase signal, and the phase difference between the in-phase and quadrature-phase signals is not exactly 90 degrees, either. This is referred to as an I/Q mismatch, and affects the quality of the received signal.

Figure 1A:
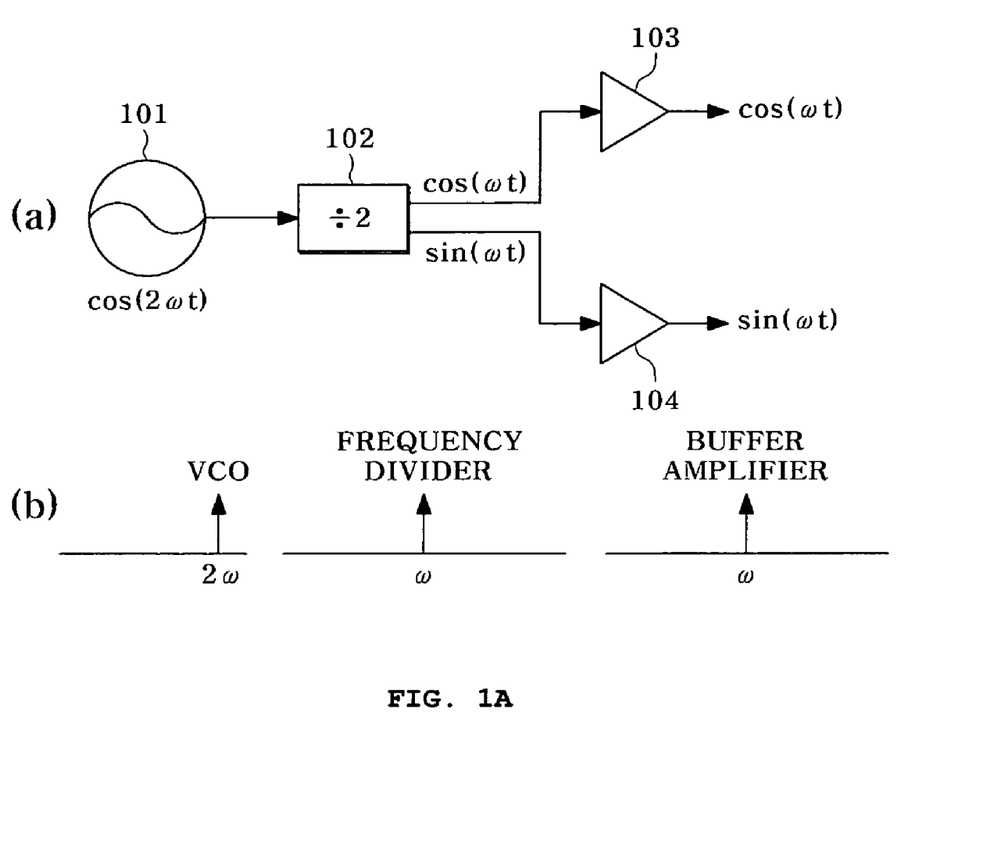
FIGS. 1A to 1C illustrate different structures of a conventional voltage controlled oscillator having a frequency divider.
Figure 1B:
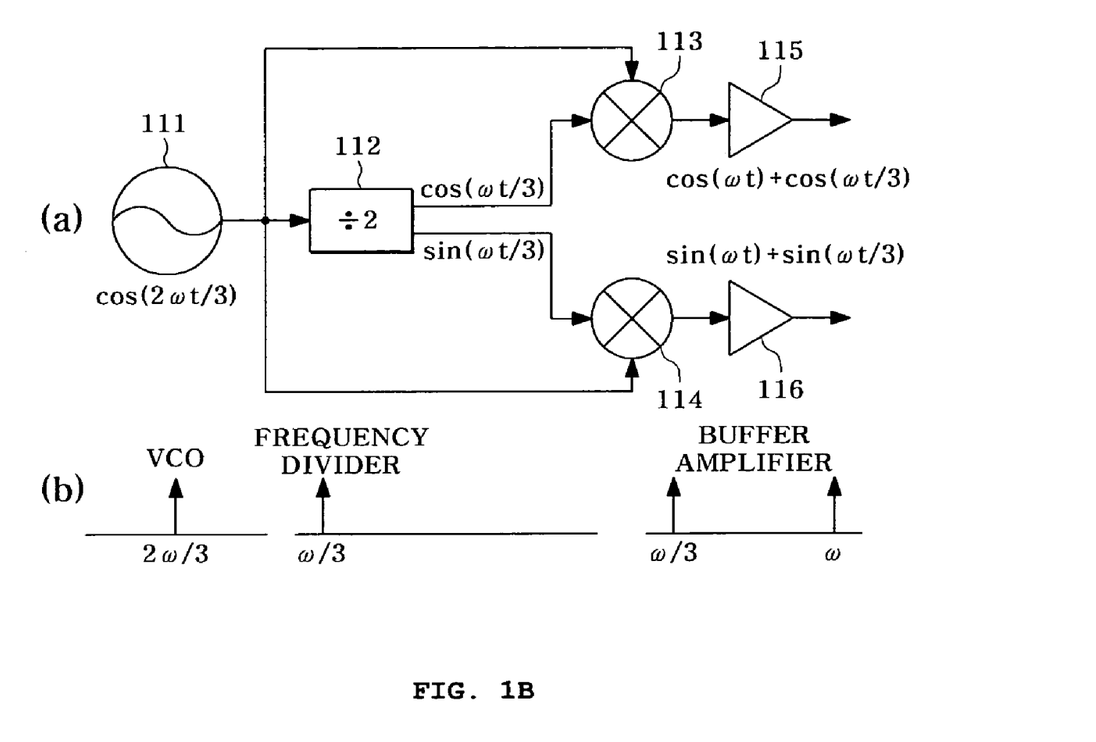
Figure 1C:
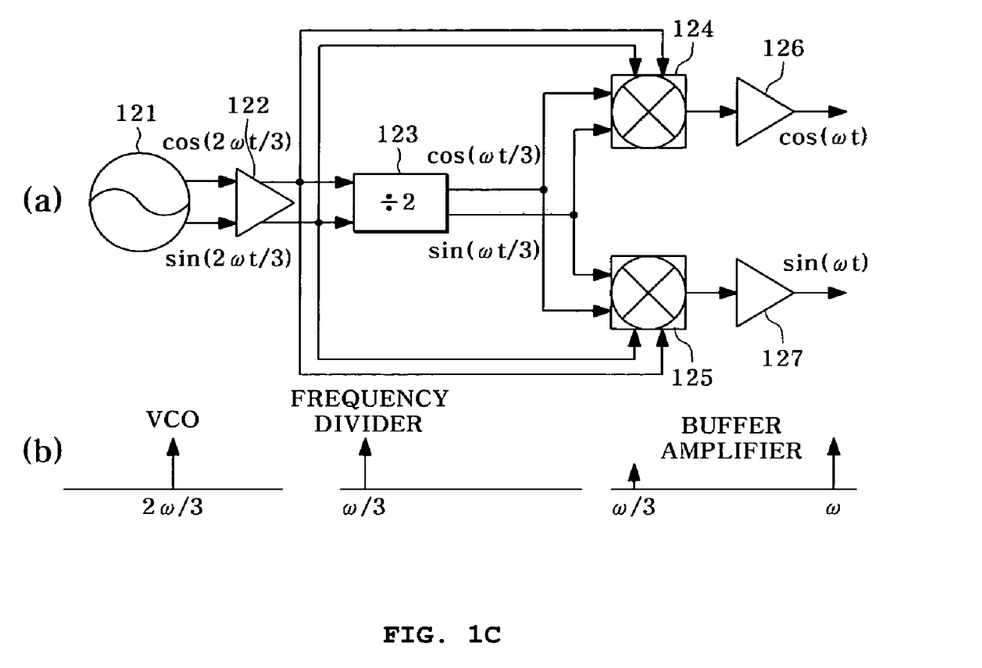

FIGS. 1A to 1C illustrate different structures of a conventional local oscillator that generates I/Q signal frequency using a voltage controlled oscillator and a frequency divider.

Referring to (a) of FIG. 1A, a signal having a frequency $2\omega$ corresponding to twice a local oscillation frequency $\omega$ is generated by a differential voltage controlled oscillator 101, and the frequency of the differential voltage controlled oscillator 101 is divided in half by a frequency divider 102 to output a quadrature local oscillation frequency.

Graph (b) of FIG. 1A illustrates frequencies of output signals of the differential voltage controlled oscillator 101, a frequency divider 102, and buffer amplifiers 103 and 104. The differential voltage controlled oscillator 101 outputs the frequency $2\omega$ to the frequency divider 102, and the frequency divider 102 outputs the local oscillation frequency $\omega$. The buffer amplifiers 103 and 104 output a signal having the local oscillation frequency $\omega$ generated by the frequency divider 102 without any change in phase.

According to this approach, since the differential voltage controlled oscillator 101 must oscillate at the frequency $2\omega$ and this approach include the frequency divider 102, power consumption disadvantageously increases. In addition, as the differential voltage controlled oscillator 101 operates at a high frequency of twice the local oscillation frequency, the frequency divider 102 must also operate at a fast speed.

Referring to (a) of FIG. 1B, a signal having a frequency $2\omega/3$ is generated by a differential voltage controlled oscillator 111, and the frequency of the differential voltage controlled oscillator 111 is divided in half by a frequency divider 112.

The resulting two signals having the frequencies $2\omega/3$ and $\omega/3$ are then input to mixers 113 and 114 to output a signal having the frequency $\omega/3$ and a signal having the frequency $\omega$.

Graph (b) of FIG. 1B illustrates frequencies of output signals of the differential voltage controlled oscillator 111, the frequency divider 112, and buffer amplifiers 115 and 116. The differential voltage controlled oscillator 111 outputs a frequency $2\omega/3$ to the frequency divider 112, and the frequency divider 112 outputs a frequency $\omega/3$.

These two frequencies are subjected to mixers 113 and 114 to output a signal having the frequency $\omega/3$ and a signal having the frequency $\omega$. Signals having the same frequencies $\omega/3$ and $\omega$ as the mixers 113 and 114 are output from the buffer amplifiers 115 and 116 without any change in phase.

According to this approach, quadrature-phase signals of the output stage become $\cos(\omega t)+\cos(\omega t/3)$ and $\sin(\omega t)+\sin(\omega t/3)$, so that a frequency corresponding to $\omega t/3$ remains. Such a frequency is referred to as an image frequency, and must be removed in order to output a clear and accurate signal. Therefore, when the approach of FIG. 1B is employed, a filter for removing the image frequency must be additionally disposed at an output where the frequency is converted.

Block diagram (a) of FIG. 1C corresponds to a case in which the differential voltage controlled oscillator of FIG. 1B is replaced by a quadrature voltage controlled oscillator 121, and the mixers 113 and 114 of FIG. 1B are replaced by single side band (SSB) mixers 124 and 125, which employ a single sideband frequency to cancel off the image signal so that accurate I and Q signals may be output.

Graph (b) of FIG. 1C illustrates frequencies of output signals of the quadrature voltage controlled oscillator 121, the frequency divider 123, and buffer amplifiers 126 and 127 of an output stage. The quadrature voltage controlled oscillator 121 outputs a frequency $2\omega/3$ to the frequency divider 123, and the frequency divider 123 outputs a frequency $\omega/3$.

The two frequencies are subjected to SSB mixers 124 and 125 to output a signal having a frequency ($\omega/3$ and a signal having a frequency $\omega$. Signals having the same frequencies $\omega/3$ and $\omega$ output by the SSB mixers 124 and 125 are output from the buffer amplifiers 126 and 127 of the output stage without any change in phase. In this case, the SSB mixers 124 and 125 are employed to reduce the magnitude of the signal having the image frequency $\omega/3$.

However, since the configuration of FIG. 1C, like the configuration of FIG. 1B, includes the frequency divider, the frequency divider may malfunction at high frequency. In addition, the frequency of the voltage controlled oscillator for generating the quadrature-phase signal is as high as several GHz, so that accuracy of the I and Q signals is reduced.

SUMMARY OF THE INVENTION

It is an object of the present invention to provide a local oscillator for outputting reliable I and Q signals at a high frequency without using a frequency divider.

In order to achieve the above object, according to one aspect of the present invention, a local oscillator comprises: a quadrature voltage controlled oscillator generating I and Q signals having a frequency which is one-third of a local oscillation frequency, and a differential second-harmonic signal having a frequency which is two-thirds of the local oscillation frequency; a poly-phase filter converting the differential second-harmonic signal input from the quadrature voltage controlled oscillator into I and Q signals; and a single side band (SSB) mixer receiving the I and Q signals having the frequency which is one-third of the local oscillation frequency from the quadrature voltage controlled oscillator as an input and receiving the I and Q signals having the frequency which is two-thirds of the local oscillation frequency from the poly-phase filter as an input, and outputting the I and Q signals having the local oscillation frequency.

The quadrature voltage controlled oscillator may comprise: a first differential voltage controlled oscillator connected between a power supply and a first current source and generating an In-phase signal; first and second coupling transistors each having a first terminal receiving a quadrature-phase signal output from a second differential voltage controlled oscillator, a second terminal connected to a second current source, and a third terminal connected to the first differential voltage controlled oscillator; the second differential voltage controlled oscillator connected between the power supply and a third current source and outputting the quadrature-phase signal; and third and fourth coupling transistors each having a first terminal receiving the in-phase signal output from the first differential voltage controlled oscillator, a second terminal connected to a fourth current source, and a third terminal connected to the second differential voltage controlled oscillator.

The first differential voltage controlled oscillator may comprise: a first switching transistor having a first terminal connected to a third terminal of a second switching transistor, a second terminal connected to a second terminal of the second switching transistor, and a third terminal connected to a first terminal of the second switching transistor; the second switching transistor having the first terminal connected to the third terminal of the first switching transistor, the second terminal connected to the second terminal of the first switching transistor, and the third terminal connected to the first terminal of the first switching transistor; and a first LC resonator connected between the power supply and the third terminals of the first and second switching transistors, wherein the second terminals of the first and second switching transistors are connected to the first current source, and the third terminals of the first and second switching transistors are connected to the respective third terminals of the first and second coupling transistors and output the In-phase signals.

The second differential voltage controlled oscillator may comprise: a third switching transistor having a first terminal connected to a third terminal of a fourth switching transistor, a second terminal connected to a second terminal of the fourth switching transistor, and a third-terminal connected to a first terminal of the fourth switching transistor; the fourth switching transistor having the first terminal connected to the third terminal of the third switching transistor, the second terminal connected to the second terminal of the third switching transistor, and the third terminal connected to the first terminal of the third switching transistor; and a second LC resonator connected between the power supply and the third terminals of the third and fourth switching transistors, wherein the second terminals of the third and fourth switching transistors are connected to the third current source, and the third terminals of the third and fourth switching transistors are connected to the respective third terminals of the third and fourth coupling transistors and output the quadrature-phase signals.

The first LC resonator may comprise: first and second inductors connected at one end to the power supply and at the other end to the respective third terminals of the first and second switching transistors; and first and second varactors connected at one end to the third terminals of the first and second switching transistors and at the other end to each other, wherein a control voltage for controlling a frequency of the In-phase signal is applied to a node where the other end of the first and second varactors are connected.

The second LC resonator may comprise: third and fourth inductors connected at one end to the power supply and at the other end to the respective third terminals of the third and fourth switching transistors; and third and fourth varactors connected at one end to the third terminals of the third and fourth switching transistors and at the other end to each other, wherein a control voltage for controlling a frequency of the quadrature-phase signal is applied to a node where the other end of the third and fourth varactors are connected.

The transistor may be an n-type transistor, the first terminal may be a gate, the second terminal may be a source, and the third terminal may be a drain. Also, the n-type transistor may be any one of a Bipolar Junction Transistor (BJT), a Junction Field Effect Transistor (JFET), a Metal Oxide Semiconductor Field Effect Transistor (MOSFET), and a Metal Semiconductor Field Effect Transistor (MESFET).

The local oscillator may further comprise: a buffer amplifier connected between the quadrature voltage controlled oscillator and the poly-phase filter and amplifying the differential second-harmonic signal output from the quadrature voltage controlled oscillator, wherein the buffer amplifier suppresses an oscillation frequency of the quadrature voltage controlled oscillator from being changed due to a change in impedance of an output stage of the quadrature voltage controlled oscillator.

The local oscillator may further comprise: a buffer amplifier connected to an output stage of the SSB mixer and amplifying a signal output from the SSB mixer.

The SSB mixer may block an image frequency and allow a signal having the local oscillation frequency to pass.

BRIEF DESCRIPTION OF THE DRAWINGS

The foregoing and other objects, features and advantages of the invention will be apparent from the following more particular description of exemplary embodiments of the invention, as illustrated in the accompanying drawings. The drawings are not necessarily to scale, emphasis instead being placed upon illustrating the principles of the invention.

DETAILED DESCRIPTION OF THE INVENTION

The present invention will now be described more fully hereinafter with reference to the accompanying drawings, in which exemplary embodiments of the invention are shown. This invention may, however, be embodied in different forms and should not be construed as limited to the exemplary embodiments set forth herein. Rather, these exemplary embodiments are provided so that this disclosure will be thorough and complete, and will fully convey the scope of the invention to those skilled in the art. Like reference numerals refer to like elements throughout the drawings.

Figure 2:
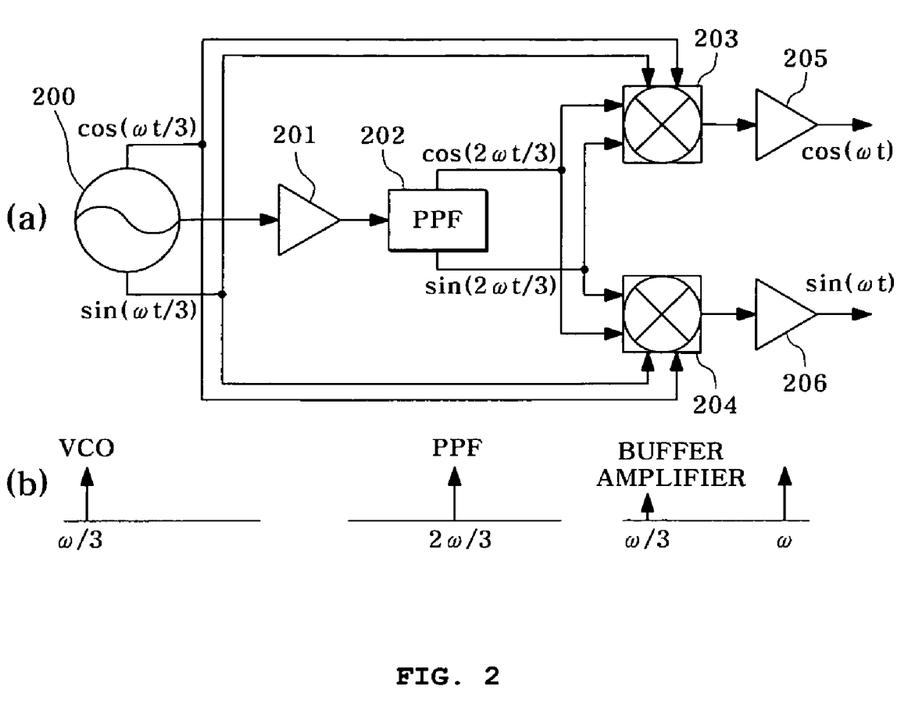
FIG. 2 illustrates a local oscillator without a frequency divider in accordance with an exemplary embodiment of the present invention.

FIG. 2 is a configuration diagram illustrating a local oscillator without a frequency divider in accordance with an exemplary embodiment of the present invention.

Referring to FIG. 2, the local oscillator without a frequency divider includes a quadrature voltage controlled oscillator 200, a first buffer amplifier 201, a second buffer amplifier 205, a third buffer amplifier 206, a poly-phase filter 202, a first single side band (SSB) mixer 203, and a second SSB mixer 204.

The quadrature voltage controlled oscillator 200 generates I and Q signals having a frequency $\omega/3$ corresponding to one-third of a local oscillation frequency $\omega$, and a differential second-harmonic signal having a frequency $2\omega/3$.

The poly-phase filter 202 receives the differential second-harmonic signal having the frequency $2\omega/3$ as an input through the first buffer amplifier 201, and converts it into I and Q signals having the frequency $2\omega/3$.

Each of the SSB mixers 203 and 204 receives, as inputs, the I and Q signals having the frequency $\omega/3$ output by the quadrature voltage controlled oscillator 200, and the I and Q signals having the frequency $2\omega/3$ output by the poly-phase filter 202, suppresses the image frequency $\omega/3$ to remove the image, and outputs a signal having the local oscillation frequency $\omega$.

Figure 3:
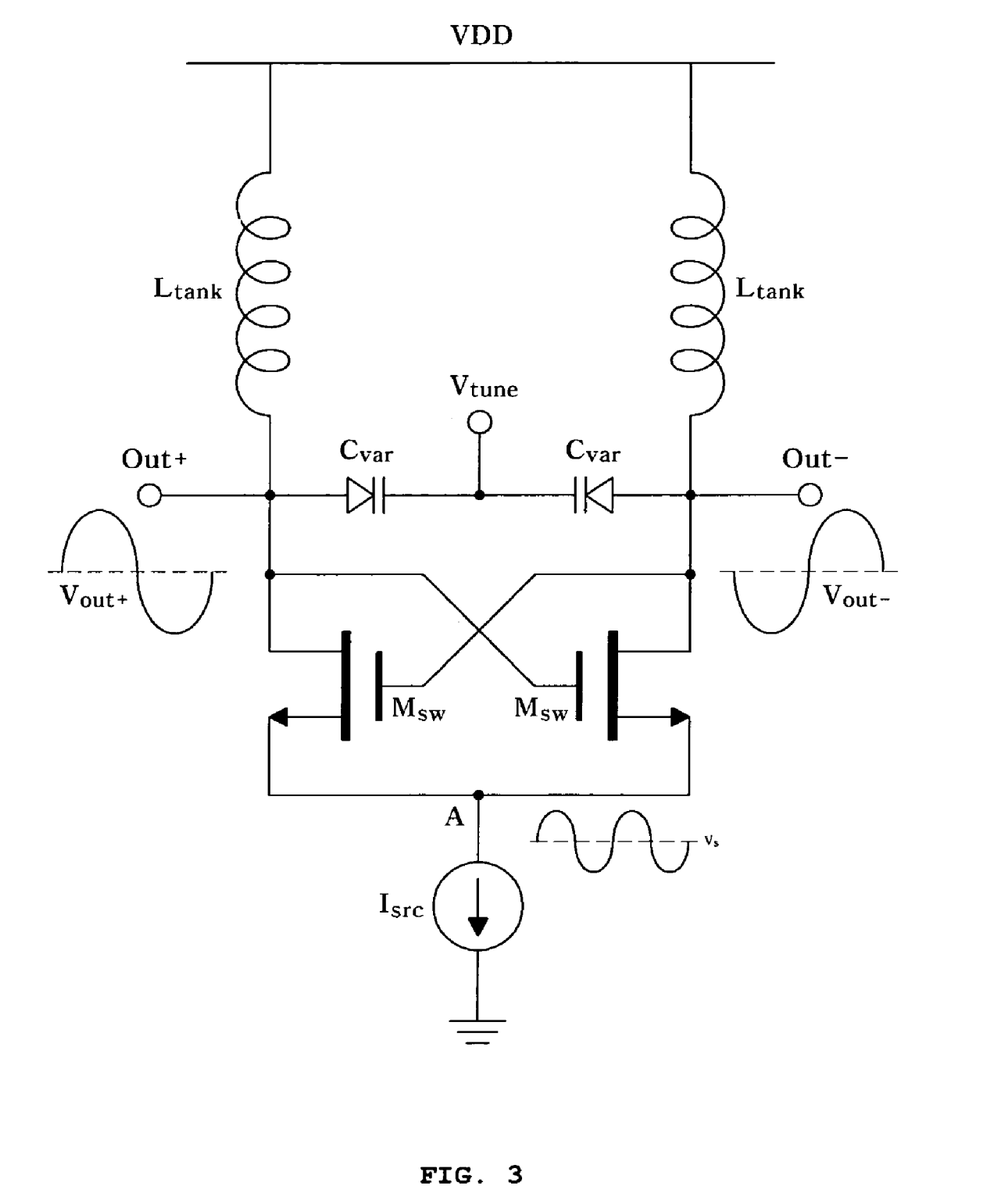
FIG. 3 is a circuit diagram of a differential voltage controlled oscillator.

FIG. 3 is a circuit diagram illustrating a differential voltage controlled oscillator.

Referring to FIG. 3, the differential voltage controlled oscillator is composed of inductors Ltank and varactors Cvar for determining a resonant frequency, Metal Oxide Semiconductor (MOS) transistors Msw for making a negative resistance, and a current source Isrc setting a bias for generating a constant current.

The frequency at a node A where two MOS transistors are connected in common is twice as high as the frequency at the node Out, and the amplitude at the node A which has the harmonic frequency component two times higher than the node Out is smaller than the amplitude at the node Out. Here, an amplitude of hundreds of mV may be obtained when the MOS transistors and the bias current are properly adjusted.

Figure 4:
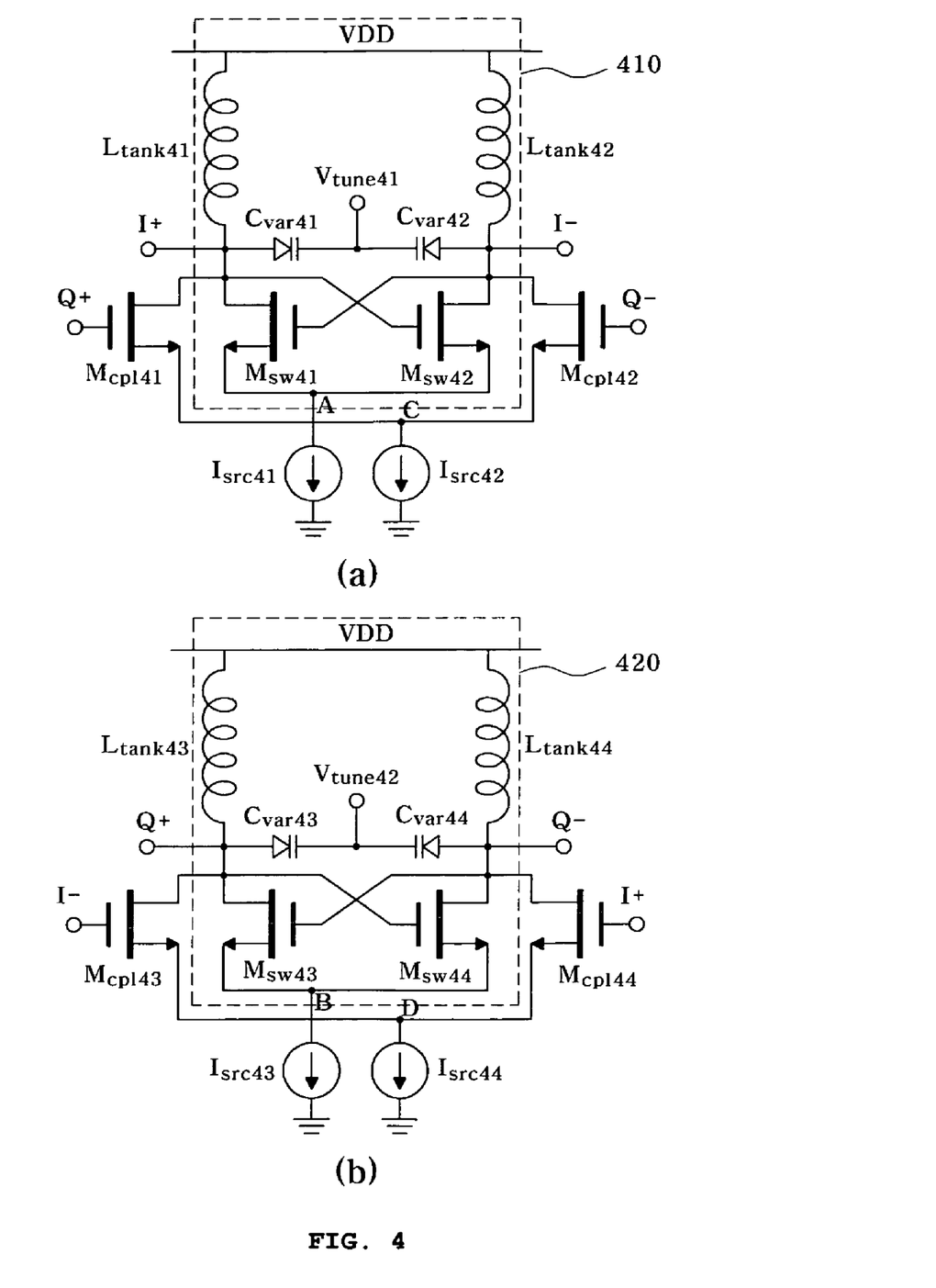
FIG. 4 is a circuit diagram of a quadrature voltage controlled oscillator shown in FIG. 2.

FIG. 4 is a circuit diagram of the quadrature voltage controlled oscillator illustrated in FIG. 2.

Referring to FIG. 4, the quadrature voltage controlled oscillator 200 is composed of coupled circuits (a) and (b).

Circuit (a) is composed of a first differential voltage controlled oscillator 410, first and second current sources Isrc41 and Isrc42, and first and second coupling transistors Mcpl41 and Mcpl42. Circuit (a) outputs +/− in-phase signals which have substantially the same magnitude and a phase difference of substantially 180 degrees. Similarly, Circuit (b) is composed of a second differential voltage controlled oscillator 420, third and fourth current sources Isrc43 and Isrc44, and third and fourth coupling transistors Mcpl43 and Mcpl44. Circuit (b) outputs +/− quadrature-phase signals which have substantially the same magnitude and a phase difference of substantially 180 degrees.

Here, there is a phase difference of 90 degrees between respective in-phase and quadrature-phase signals. Thus, when the in-phase signals have phases of 0 and 180 degrees, for example, the quadrature-phase signals have phases of 90 and 270 degrees.

In circuit (a) of FIG. 4, the first differential voltage controlled oscillator 410 is connected between a power supply VDD and the first current source Isrc41, and outputs a signal having a constant frequency in response to an applied control voltage Vtune41. Drains of the first and second coupling transistors Mcpl41 and Mcpl42 are connected to the first differential voltage controlled oscillator 410, and sources thereof are connected to each other and to the second current source Isrc42.

In addition, an output signal Q+ of the second differential voltage controlled oscillator 420 is input to a gate of the first coupling transistor Mcpl41, and an output signal Q− of the second differential voltage controlled oscillator 420 is input to a gate of the second coupling transistor Mcpl42.

Similarly, in circuit (b) of FIG. 4, the second differential voltage controlled oscillator 420 is connected between a power supply VDD and the third current source Isrc43, and outputs a signal having a constant frequency in response to an applied control voltage Vtune42. Drains of the third and fourth coupling transistors Mcpl43 and Mcpl44 are connected to the second differential voltage controlled oscillator 420, and sources thereof are connected to each other and to the fourth current source Isrc44.

In addition, an output signal I− of the first differential voltage controlled oscillator 410 is input to a gate of the third coupling transistor Mcpl43, and an output signal I+ of the first differential voltage controlled oscillator 410 is input to a gate of the fourth coupling transistor Mcpl44.

Below, circuits constituting the first and second differential voltage controlled oscillators 410 and 420 illustrated in (a) and (b) of FIG. 4 will be described. Since the first differential voltage controlled oscillator 410 is the same as the second differential voltage controlled oscillator 420, the description below will be based on the first differential voltage controlled oscillator 410.

The first differential voltage controlled oscillator 410 includes first and second switching transistors Msw41 and Msw42, first and second inductors Ltank41 and Ltank42, and first and second varactors Cvar41 and Cvar42.

The first and second switching transistors Msw41 and Msw42 of the first differential voltage controlled oscillator 410 are cross-coupled to each other to generate a negative resistance of the first differential voltage controlled oscillator 410. Specifically, a gate of the first switching transistor Msw41 is connected to a drain of the second switching transistor Msw42, a drain of the first switching transistor Msw41 is connected to a gate of the second switching transistor Msw42, and a source of the first switching transistor Msw41 is connected to a source of the second switching transistor MSw42. In addition, the sources of the first and second switching transistors Msw41 and Msw42 are connected to the first current source Iscr41, and the drains of the first and second switching transistors Msw41 and Msw42 are connected to drains of the coupling transistors Mcpl41 and Mcpl42 outside the first differential voltage controlled oscillator 410 and to the second current source Isrc42.

The first and second inductors Ltank41 and Ltank42 and the first and second varactors Cvar41 and Cvar42 within the first differential voltage controlled oscillator 410 form an LC resonant unit which resonates to output an oscillation signal. In this case, the frequency of the oscillation signal varies with the impedance of the LC resonator. Specifically, capacitances of the first and second varactors Cvar41 and Cvar42 vary in response to the control voltage Vtune41, so that the frequency of the output signal changes.

When the first differential voltage controlled oscillator 410 oscillates at a specific frequency A, its output signals I+ and I− are applied to the second differential voltage controlled oscillator 420 through the third and fourth coupling transistors Mcpl43 and Mcpl44. In this case, differential output signals of the first differential voltage controlled oscillator 410 are superimposed upon the common source node B of the second differential voltage controlled oscillator 420 through the third and fourth coupling transistors Mcpl43 and Mcpl44, so that a differential second-harmonic signal having a frequency 2ω, twice the specific frequency ω, is generated.

Similarly, the output signals Q+ and Q− of the second differential voltage controlled oscillator 420 are delivered to the first differential voltage controlled oscillator 410 through the first and second coupling transistors Mcpl41 and Mcpl42, so that a differential second-harmonic signal having the frequency 2ω is generated at the common source node A of the first differential voltage controlled oscillator 410.

Eight active elements (Mcpl41 to Mcpl44, and Msw41 to Msw44) used in the quadrature voltage controlled oscillator 200 have gates, sources, and drains, and each of the active elements has the characteristic that the magnitude and direction of current flowing from the drain to the source or vice versa is determined by the magnitude and polarity of the voltage applied between the gate and the source.

The active elements may be Bipolar Junction Transistors (BJTs), Junction Field Effect Transistors (JFETs), Metal Oxide Semiconductor Field Effect Transistors (MOSFETs), or Metal Semiconductor Field Effect Transistors (MESFETs).

Some active elements have a body terminal in addition to the gate, source, and drain. Such active elements also have the characteristic that the magnitude and direction of current flowing from the source to the drain or vice versa is determined by the magnitude and polarity of the voltage applied between the gate and the body terminal. Such active elements may be Metal Oxide Semiconductor Field Effect Transistors (MOSFETs) and so forth.

While the above-described exemplary embodiments are based on the MOSFET, the present invention can be applied to all active elements having the above-described characteristics. Accordingly, the scope of the present invention is not limited to the MOSFET.

In addition, while the above-described exemplary embodiments are based on an n-type MOSFET, this is simply for clarity and it will be clear to those skilled in the art that the present invention is not limited to any specific type of MOSFET and any type can be employed to perform the same function.

Figure 5:
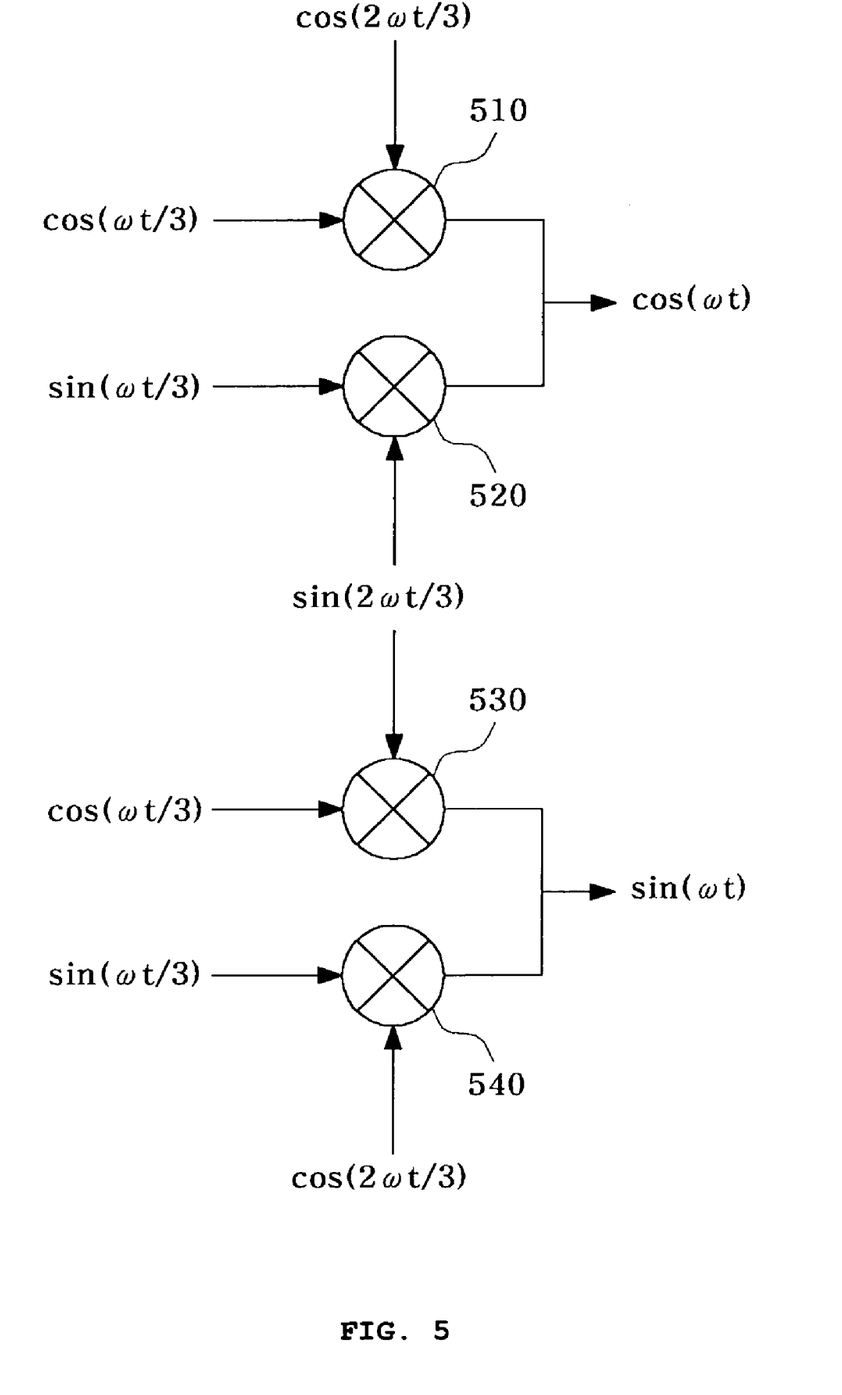
FIG. 5 illustrates single side band (SSB) mixers shown in FIG. 2.

FIG. 5 illustrates single side band (SSB) mixers shown in FIG. 2.

Referring to FIG. 5, SSB mixers 203 and 204 remove the signal having the image frequency using four mixers 510 to 540, and output only the signal that needs to be output.

The mixers receive, as inputs, the I and Q signals having the frequency of one-third of the local oscillation frequency among output signals of the quadrature voltage controlled oscillator 200 and the I and Q signals having the frequency of two-thirds of the local oscillation frequency output from the poly-phase filter 202. The mixers convert the frequencies of the signals and output the I and Q signals having the local oscillation frequency, among the converted frequencies.

When two RF signals and an LO signal are applied to the mixer, ωLO±ωRF is output as a main output.

That is, two frequency components are spaced apart from the center frequency component of the LO signal, one spaced apart frequency component being a desired frequency component, and the other being an unnecessary image component.

Such an image distorts the desired signal and therefore must be removed or sufficiently suppressed. Therefore, the SSB mixers 203 and 204 pass the desired signal and suppress the unnecessary image components.

Figure 6A:
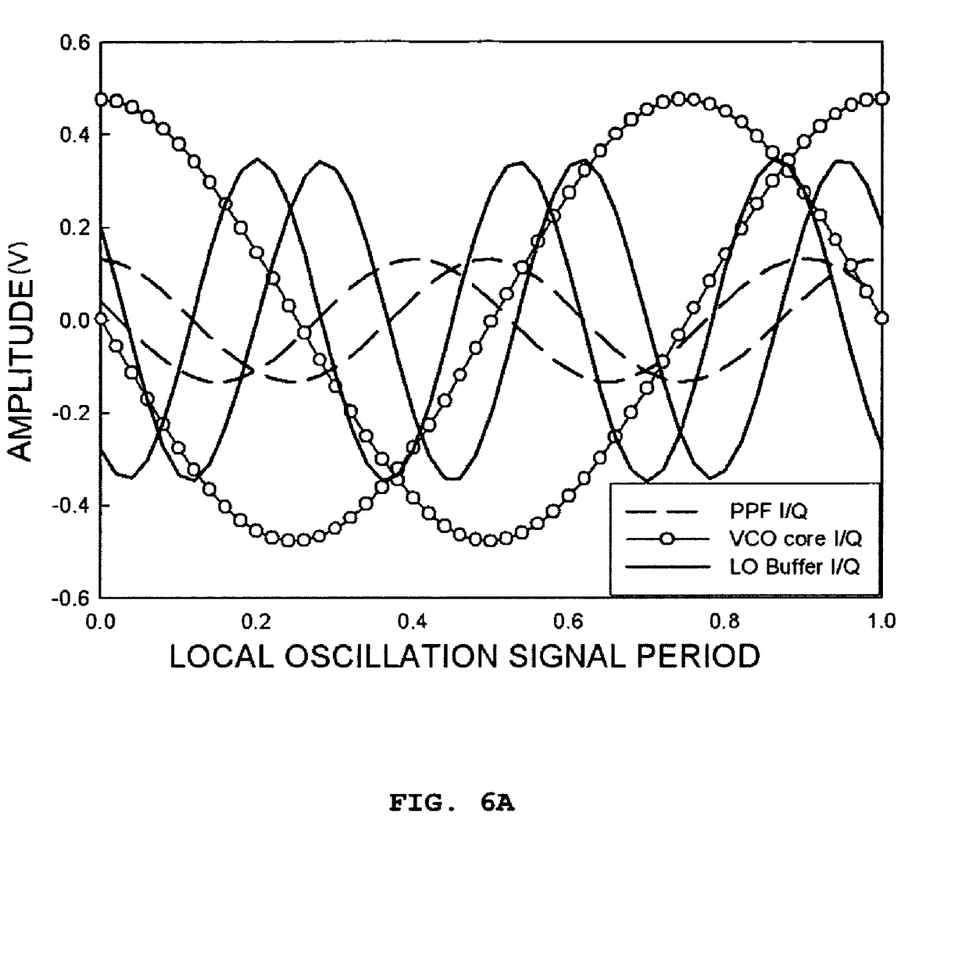
FIGS. 6A to 6C are graphs of simulation data illustrating characteristics of a local oscillator without a frequency divider.
Figure 6B:
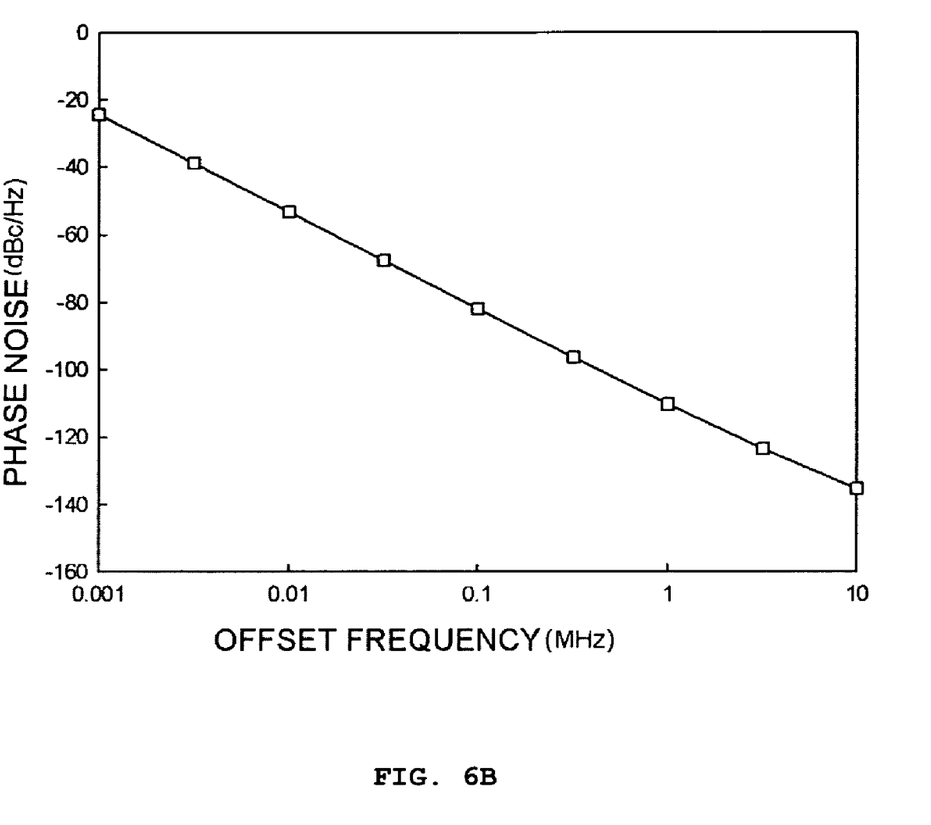
Figure 6C:
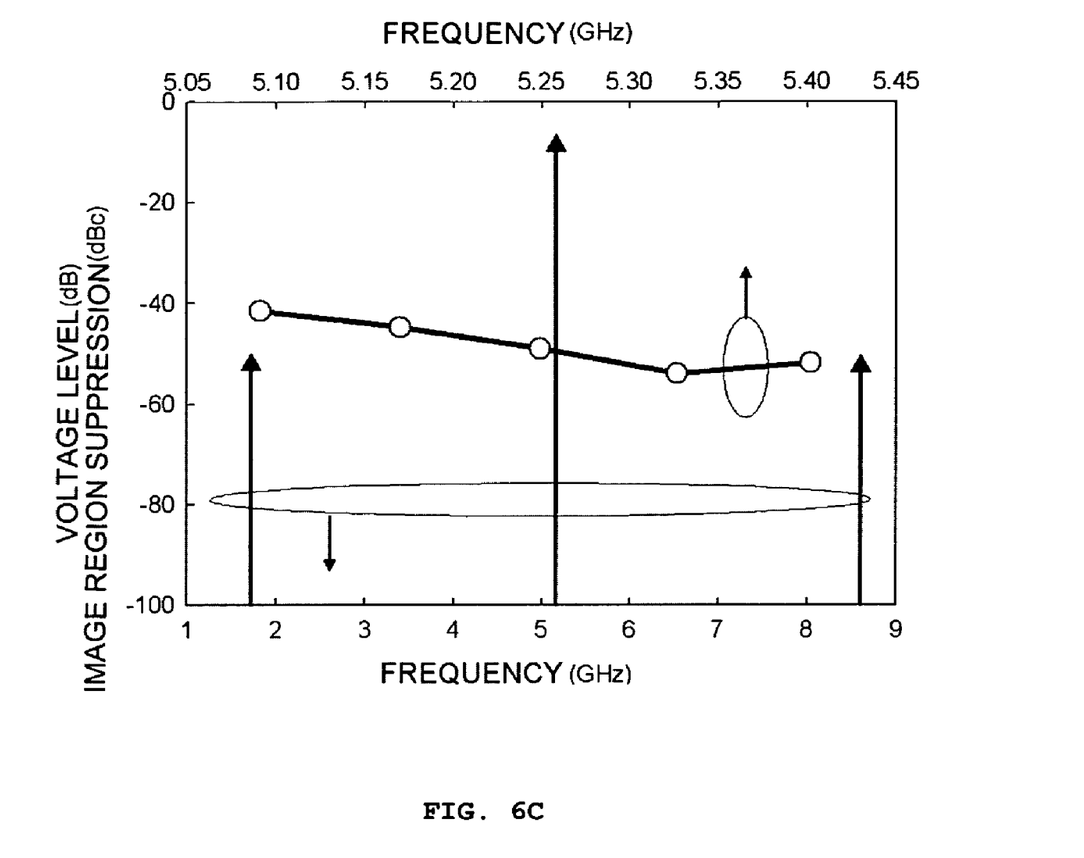

FIGS. 6A to 6C are graphs of simulation data illustrating characteristics of a local oscillator without a frequency divider.

FIG. 6A is a graph illustrating signal waveforms of the voltage controlled oscillator, the poly-phase filter, and the final outputs, FIG. 6B is a graph illustrating a phase noise characteristic of the voltage controlled oscillator, and FIG. 6C is a graph illustrating frequency suppression in the image band.

The simulation was designed to generate a final frequency of 5.15 GHz to 5.35 GHz, which is a frequency band of 5 GHz wireless local area network (WLAN), and a fundamental frequency of 1.7 GHz to 1.8 GHz at the quadrature voltage controlled oscillator 100. A 0.18 um complementary MOS (CMOS) process was employed for the simulation.

Referring to FIG. 6A, a differential second-harmonic signal having a frequency of 3.4 GHz to 3.6 GHz is output and converted into I and Q signals through the buffer amplifier and the poly-phase filter. When the I and Q signals having the second-harmonic frequency and the I and Q signals having the fundamental frequency are applied to the SSB mixers, frequencies of 5.1 GHz to 5.4 GHz are output as the final outputs.

FIG. 6B illustrates a simulation result of −110 dBc/Hz at the 1 MHz offset frequency. That is, it was observed that the energy of the frequencies spaced apart from the frequency of 5.25 GHz by 1 MHz is 110 dB lower than the energy of the frequency of 5.25 GHz.

FIG. 6C illustrates the degree of the suppressed frequency in the image band when the control voltage of the varactor of the quadrature voltage controlled oscillator 100 varies to change the frequency. As a result of the simulation, it was confirmed that the image frequency may be suppressed by 40 dB or more.

As described above, a local oscillator without a frequency divider according to the present invention can advantageously reduce power consumption compared to a local oscillator using a frequency divider.

In addition, the present invention has a configuration in which a quadrature voltage controlled oscillator outputs a signal having a frequency lower than in a conventional configuration, so that I and Q mismatch can be reduced and a filter for canceling off an image may not be required.

Exemplary embodiments of the present invention have been disclosed herein and, although specific terms are employed, they are meant to be interpreted in a generic and descriptive sense only and not for the purpose of limitation. Accordingly, it will be understood by those of ordinary skill in the art that various changes in form and details may be made to the exemplary embodiments without departing from the spirit and scope of the present invention as set forth in the following claims.

What is claimed is:

1. A local oscillator, comprising:
a quadrature voltage controlled oscillator generating I and Q signals having a frequency which is one-third of a local oscillation frequency, and a differential second-harmonic signal having a frequency which is two-thirds of the local oscillation frequency;
a poly-phase filter converting the differential second-harmonic signal input from the quadrature voltage controlled oscillator into I and Q signals; and
a single side band (SSB) mixer receiving the I and Q signals having the frequency which is one-third of the local oscillation frequency from the quadrature voltage controlled oscillator as an input and receiving the I and Q signals having the frequency which is two-thirds of the local oscillation frequency from the poly-phase filter as an input, and outputting the I and Q signals having the local oscillation frequency.

2. The local oscillator according to claim 1, wherein the quadrature voltage controlled oscillator comprises:
   a first differential voltage controlled oscillator connected between a power supply and a first current source and generating an In-phase signal;
   first and second coupling transistors each having a first terminal receiving a quadrature-phase signal output from a second differential voltage controlled oscillator, a second terminal connected to a second current source, and a third terminal connected to the first differential voltage controlled oscillator;
   the second differential voltage controlled oscillator connected between the power supply and a third current source and outputting the quadrature-phase signal; and
   third and fourth coupling transistors each having a first terminal receiving the in-phase signal output from the first differential voltage controlled oscillator, a second terminal connected to a fourth current source, and a third terminal connected to the second differential voltage controlled oscillator.

3. The local oscillator according to claim 2, wherein the first differential voltage controlled oscillator comprises:
   a first switching transistor having a first terminal connected to a third terminal of a second switching transistor, a second terminal connected to a second terminal of the second switching transistor, and a third terminal connected to a first terminal of the second switching transistor;
   the second switching transistor having the first terminal connected to the third terminal of the first switching transistor, the second terminal connected to the second terminal of the first switching transistor, and the third terminal connected to the first terminal of the first switching transistor; and
   a first LC resonator connected between the power supply and the third terminals of the first and second switching transistors,
   wherein the second terminals of the first and second switching transistors are connected to the first current source, and the third terminals of the first and second switching transistors are connected to the respective third terminals of the first and second coupling transistors and output the In-phase signals.

4. The local oscillator according to claim 2, wherein the second differential voltage controlled oscillator comprises:
   a third switching transistor having a first terminal connected to a third terminal of a fourth switching transistor, a second terminal connected to a second terminal of the fourth switching transistor, and a third terminal connected to a first terminal of the fourth switching transistor;
   the fourth switching transistor having the first terminal connected to the third terminal of the third switching transistor, the second terminal connected to the second terminal of the third switching transistor, and the third terminal connected to the first terminal of the third switching transistor; and
   a second LC resonator connected between the power supply and the third terminals of the third and fourth switching transistors,
   wherein the second terminals of the third and fourth switching transistors are connected to the third current source, and the third terminals of the third and fourth switching transistors are connected to the respective third terminals of the third and fourth coupling transistors and output the quadrature-phase signals.

5. The local oscillator according to claim 3, wherein the first LC resonator comprises:
   first and second inductors connected at one end to the power supply and at the other end to the respective third terminals of the first and second switching transistors; and
   first and second varactors connected at one end to the respective third terminals of the first and second switching transistors and at the other end to each other,
   wherein a control voltage for controlling a frequency of the In-phase signal is applied to a node where the other end of the first and second varactors are connected.

6. The local oscillator according to claim 4, wherein the second LC resonator comprises:
   third and fourth inductors connected at one end to the power supply and at the other end to the respective third terminals of the third and fourth switching transistors; and
   third and fourth varactors connected at one end to the respective third terminals of the third and fourth switching transistors and at the other end to each other,
   wherein a control voltage for controlling a frequency of the quadrature-phase signal is applied to a node where the other end of the third and fourth varactors are connected.

7. The local oscillator according to any one of claim 2 to 4, wherein the transistor is an n-type transistor, the first terminal is a gate, the second terminal is a source, and the third terminal is a drain.

8. The local oscillator according to claim 7, wherein the n-type transistor is any one of a Bipolar Junction Transistor (BJT), a Junction Field Effect Transistor (JFET), a Metal Oxide Semiconductor Field Effect Transistor (MOSFET), and a Metal Semiconductor Field Effect Transistor (MESFET).

9. The local oscillator according to claim 1, further comprising:
   a buffer amplifier connected between the quadrature voltage controlled oscillator and the poly-phase filter and amplifying the differential second-harmonic signal output from the quadrature voltage controlled oscillator,
   wherein the buffer amplifier suppresses an oscillation frequency of the quadrature voltage controlled oscillator from being changed due to a change in impedance of an output stage of the quadrature voltage controlled oscillator.

10. The local oscillator according to claim 1, further comprising:
    a buffer amplifier connected to an output stage of the SSB mixer and amplifying a signal output from the SSB mixer.

11. The local oscillator according to claim 1, wherein the SSB mixer blocks an image frequency and allows a signal having the local oscillation frequency to pass.

* * * * *